United States Patent
Ishikawa et al.

(10) Patent No.: US 6,777,682 B2
(45) Date of Patent: Aug. 17, 2004

(54) INFRARED DETECTOR

(75) Inventors: Tomohiro Ishikawa, Tokyo (JP); Hirofumi Yagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 33 days.

(21) Appl. No.: 10/128,570

(22) Filed: Apr. 24, 2002

(65) Prior Publication Data

US 2002/0190210 A1 Dec. 19, 2002

(30) Foreign Application Priority Data

Jun. 15, 2001 (JP) ........................................ 2001-181719
Feb. 20, 2002 (JP) ........................................ 2002-043343

(51) Int. Cl.[7] .................................................. G01J 5/20
(52) U.S. Cl. .................................. 250/338.4; 250/332
(58) Field of Search ................................ 250/330, 332, 250/338.3, 338.4, 339.02

(56) References Cited

U.S. PATENT DOCUMENTS

| | | | |
|---|---|---|---|
| 5,977,603 A | 11/1999 | Ishikawa | |
| 6,031,231 A | 2/2000 | Kimata et al. | |
| 6,329,906 B1 | * 12/2001 | Fisher et al. | 257/419 |
| 6,465,784 B1 | * 10/2002 | Kimata | 250/332 |
| 6,573,504 B2 | * 6/2003 | Iida et al. | 250/338.4 |

FOREIGN PATENT DOCUMENTS

JP    11-218442    8/1999

OTHER PUBLICATIONS

Ishikawa et al., "Low–cost 320 x 240 Uncooled IRFPA Using Conventional Silicon IC Process", SPIE Conference on Infrared Technology and Applications XXV, vol. 3698, Apr. 1999, pp. 556–564.
Tissot et al., "LETI/LIR's Amorphous Silicon Uncooled Microbolometer Development", SPIE Conference on Infrared Detectors and Focal Plane Arrays V, vol. 3379, Apr. 1998, pp. 139–144.

* cited by examiner

Primary Examiner—Constantine Hannaher
Assistant Examiner—Timothy Moran
(74) Attorney, Agent, or Firm—Leydig, Voit & Mayer, Ltd.

(57) ABSTRACT

An infrared detector includes a semiconductor substrate having a hollow, a single crystal silicon thin film opposite the hollow at a distance from the semiconductor substrate, thermoelectric converters embedded in the single crystal silicon thin film and converting heat energy generated by infrared light irradiating the single crystal silicon thin film into an electric signal, a first connecting layer embedded in the single crystal silicon thin film and electrically connecting the thermoelectric converters to each other and a second connecting layer for transmitting the electric signal output by the thermoelectric converters to a wire in the semiconductor substrate. In the infrared detector, at least one of the first and second connecting layers is a silicon compound.

9 Claims, 16 Drawing Sheets

INFRARED DETECTOR

BACKGROUND OF THE INVENTION

Field of the Invention

The present invention relates to an infrared detector and, in particular, to an infrared detector applied to an infrared focal plane array.

Here, Gt is the thermal conductance of the infrared detector, and according to the formula (1), it is effective for increasing the sensitivity Res to reduce this thermal conductance Gt. Usually, for that reason, the infrared detector is operated in a vacuum where the thermal conductivity of air is negligible. Further, the smaller the cross section of the support beam 105 is and the longer the support beam 105 is, the smaller the thermal conductivity becomes, which results in an improvement in the sensitivity of the infrared detector.

A conventional infrared detector, as shown in FIG. 22, is constituted by a semiconductor substrate 103 having a concave portion 104 on the surface thereof, a detection part 101 supported in a hollow state by a support beam 105 above the concave portion, and an absorption part 108 for effectively absorbing incoming infrared rays. The detection part 101 has a plurality of PN junction diodes 102 which are connected in series by means of a metal wire 106 so as to improve the sensitivity of the infrared detector. Further, a metal wire 107 is arranged for connecting the detection part 101 to a circuit made in the semiconductor substrate 103 through the support beam 105. The reason that the detection part 101 is supported in a hollow state apart from the semiconductor substrate 103 is to improve thermal insulation for the purpose of effectively increasing the temperature of the detection part by the incoming infrared rays. Still further, the detection part 101, the support beam 105 and a signal wire 109 are covered with an insulating material such as silicon oxide or the like.

Further, the plurality of PN junction diodes 102 are connected in series by the metal wire 106 in order to improve the sensitivity of the infrared detector. These PN junction diodes 102 are connected to a metal wire 107 embedded in the support beam 105 and the metal wire 107 is further connected to a signal wire 109 for transmitting a signal to the circuit. The performance of the infrared detector is determined by the ratio of sensitivity to noises. If there is a crystal defect or a crystal interface where crystals are in contact with each other, noises are produced. Therefore, a single crystal silicon thin film is most suitable for a silicon film in which a PN junction diode is formed. A SOI (silicon on insulator) substrate in which a silicon thin film is formed on a silicon substrate via an insulating film can be used as a semiconductor substrate and is suitable for reducing noises.

Here, the sensitivity of the infrared detector using the PN junction diodes will be described in the following. Since the sensitivity of the infrared detector Res (V/K) is proportional to the thermal coefficient of a diode dvf/dT (V/K) and is inversely proportional to the thermal conductance of the infrared detector Gt (W/K), the sensitivity of the infrared detector Res (V/K) can be expressed by the following formula (1)

$$\text{Res} \propto (dvf/dT)/Gt \qquad (1)$$

Here, Gt is the thermal conductance of the infrared detector, and according to the formula (1), it is effective for increasing the sensitivity Res to reduce this thermal conductance Gt. Usually, for that reason, the infrared detector is operated in a vacuum where the thermal conductivity of air is negligible. Further, the smaller the cross section of the support beam 105 is and the longer the support beam 105 is, the smaller the thermal conductivity becomes, which results in an improvement in the sensitivity of the infrared detector.

Further, in the case where a thermal image is detected by the use of an infrared focal plane array constituted by such an infrared detector and is displayed on a CRT screen, if the speed of the thermal response of the infrared focal plane array is slow, an after image is produced on the CRT screen to degrade an image quality.

The thermal response characteristics of the infrared focal plane array will be described in the following. The thermal response characteristics of the infrared focal plane array is usually estimated by the thermal time constant τ designated by the following formula (2).

$$\tau = Ct/Gt \qquad (2)$$

Here, Ct is a heat capacity which is determined by the volume of a detection part (corresponding to the sum of the volume of the detection part 101 and the volume of the absorption part 108 in the example of FIG. 22) and the specific heat and the density of a material used for the detection part. As the thermal time constant τ becomes smaller, the response of the infrared focal plane array becomes better. It is necessary to increase conductance in order to reduce the thermal time constant τ, so the required value of the conductance varies depending on a system to which the infrared detector is applied. In an NTSC (National Television System Committee) format, if the thermal time constant τ exceeds 30 msec, which is a period of an image display in a CRT, an after image appears.

As described above, in the conventional infrared detector, if the thermal conductance is decreased so as to improve sensitivity, reversely, the thermal time constant increases. Therefore, it is difficult to improve both characteristics at the same time.

SUMMARY OF THE INVENTION

An infrared detector according to the present invention is invented so as to solve the above mentioned problem and includes a semiconductor substrate provided with a single crystal silicon thin film arranged and held in a hollow state at a predetermined distance above the semiconductor substrate, a plurality of thermoelectric changing means which are embedded in the single crystal silicon thin film and able to change heat energy generated by an infrared ray irradiated to the single crystal silicon thin film to an electric signal, a first connecting layer which are embedded in the single crystal silicon thin film and electrically connecting the plurality of thermoelectric changing means to each other and a second connecting layer for transmitting the electric signal outputted from the thermoelectric changing means to wire formed in the semiconductor substrate. And further, at least one of said first and second connecting layers is constructed by a silicon compound.

Further, according to the present invention, the plurality of thermoelectric changing means may be connected in series by the first connecting layer.

Further, the single crystal silicon thin film may be arranged and held in a hollow state at a predetermined distance above the semiconductor substrate by a support beam.

In such an infrared detector, the second connecting layer may be embedded in the support beam.

In such an infrared detector, the second connecting layer may have a thickness different from a thickness of the single crystal silicon thin film.

In such an infrared detector, the second connecting layer may be formed of a material different from a silicon compound constituting the first connecting layer.

Further, such an infrared detector may include an infrared ray receiving part arranged in front of the single crystal silicon thin film and connected to the single crystal silicon thin film by a support column.

In such an infrared detector, the thermoelectric changing means may be formed of a junction diode, a bipolar transistor, a junction field effect transistor, a MOS transistor, or a Schottky barrier diode, or a combination of them.

DETAILED DESCRIPTION OF THE PREFERRED EMBODIMENTS

Embodiment 1

Figure 1A:
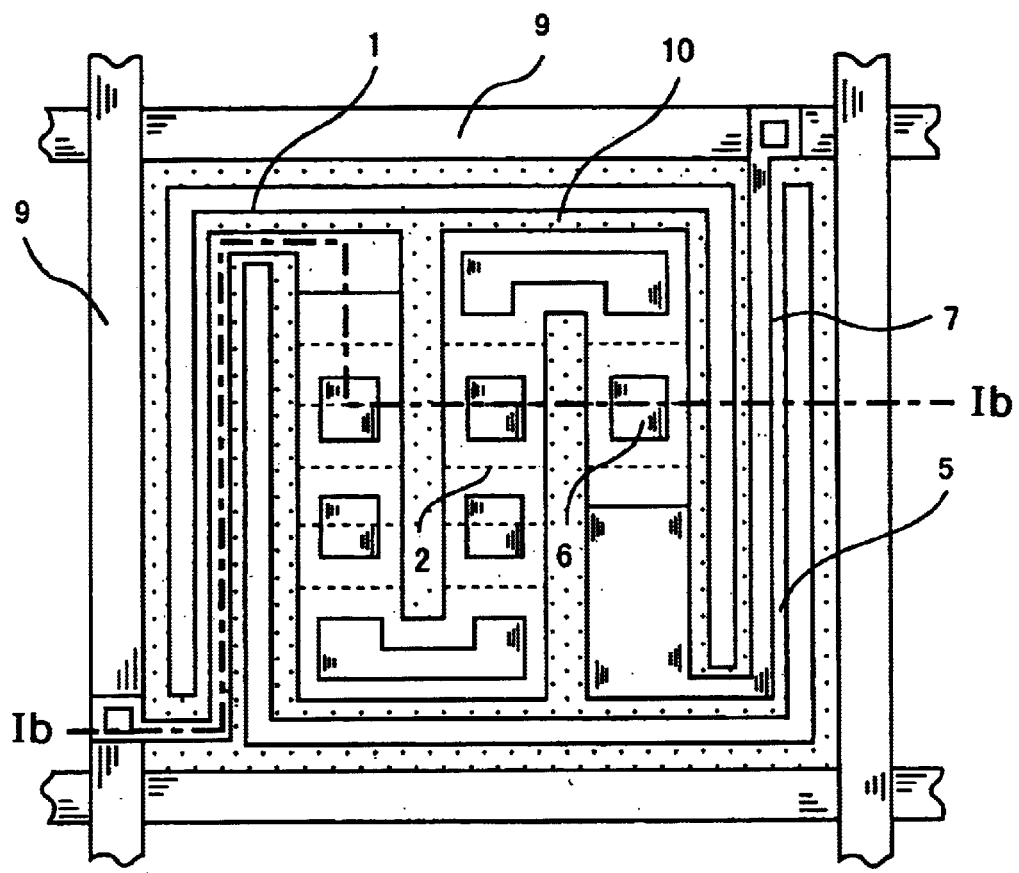
FIG. 1(a) is a top plan view showing the constitution of an infrared detector in accordance with the present invention.
Figure 1B:
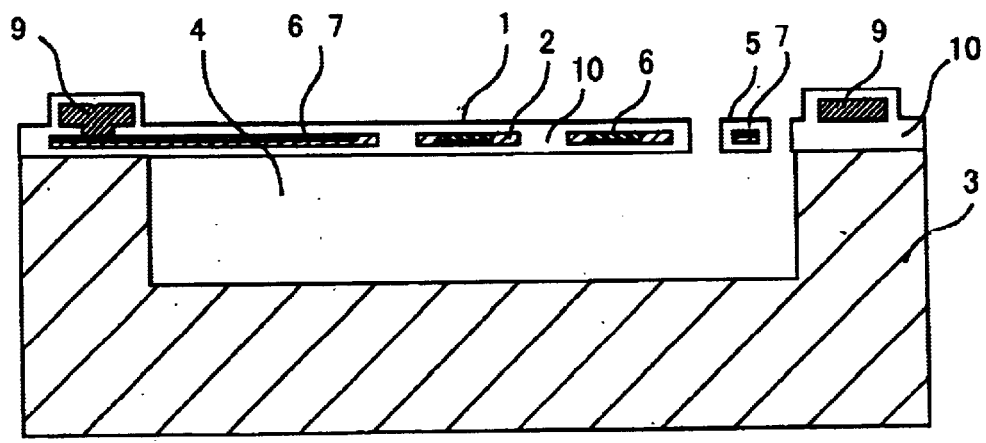
FIG. 1(b) is a cross-sectional view of FIG. 1(a).
Figure 2:
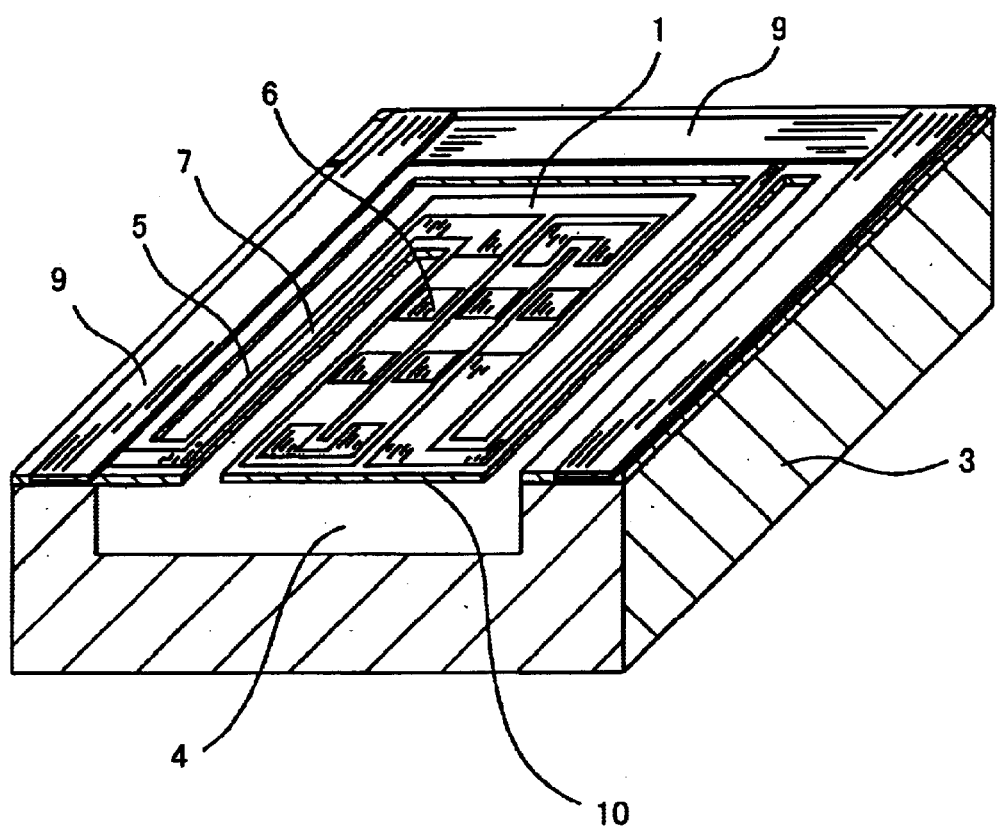
FIGS. 2, 3, and 4 are perspective views showing the constitution of an infrared detector in accordance with the present invention.
Figure 3:
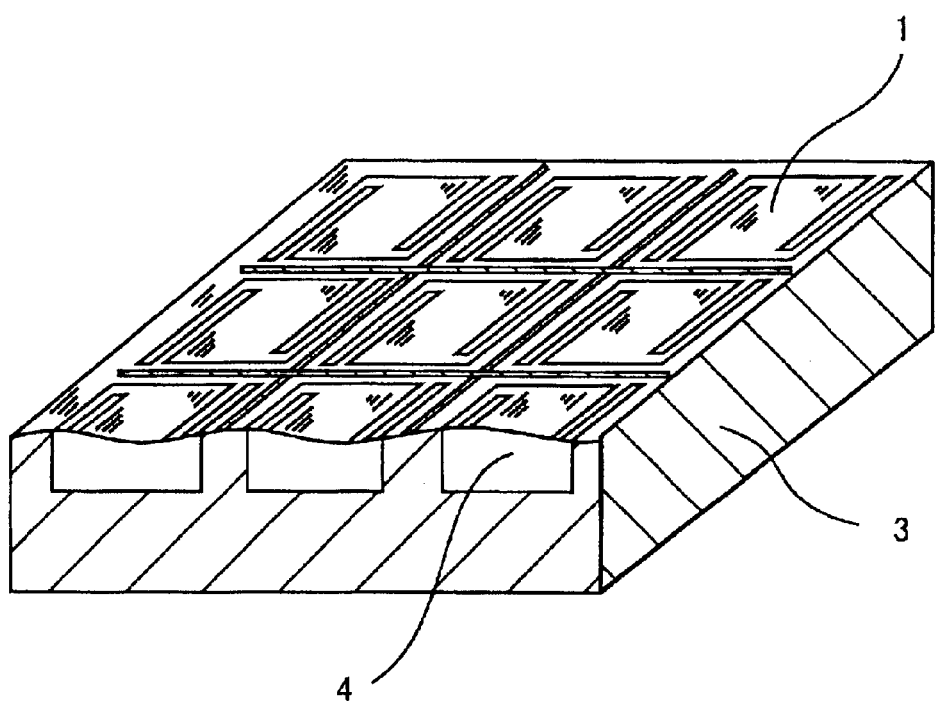
Figure 4:
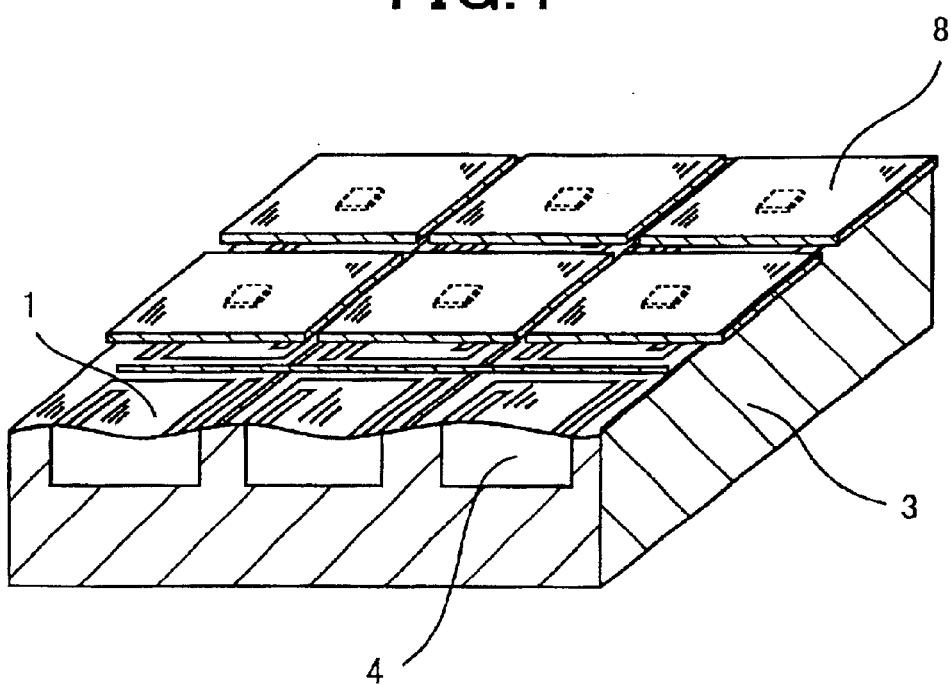
Figure 5:
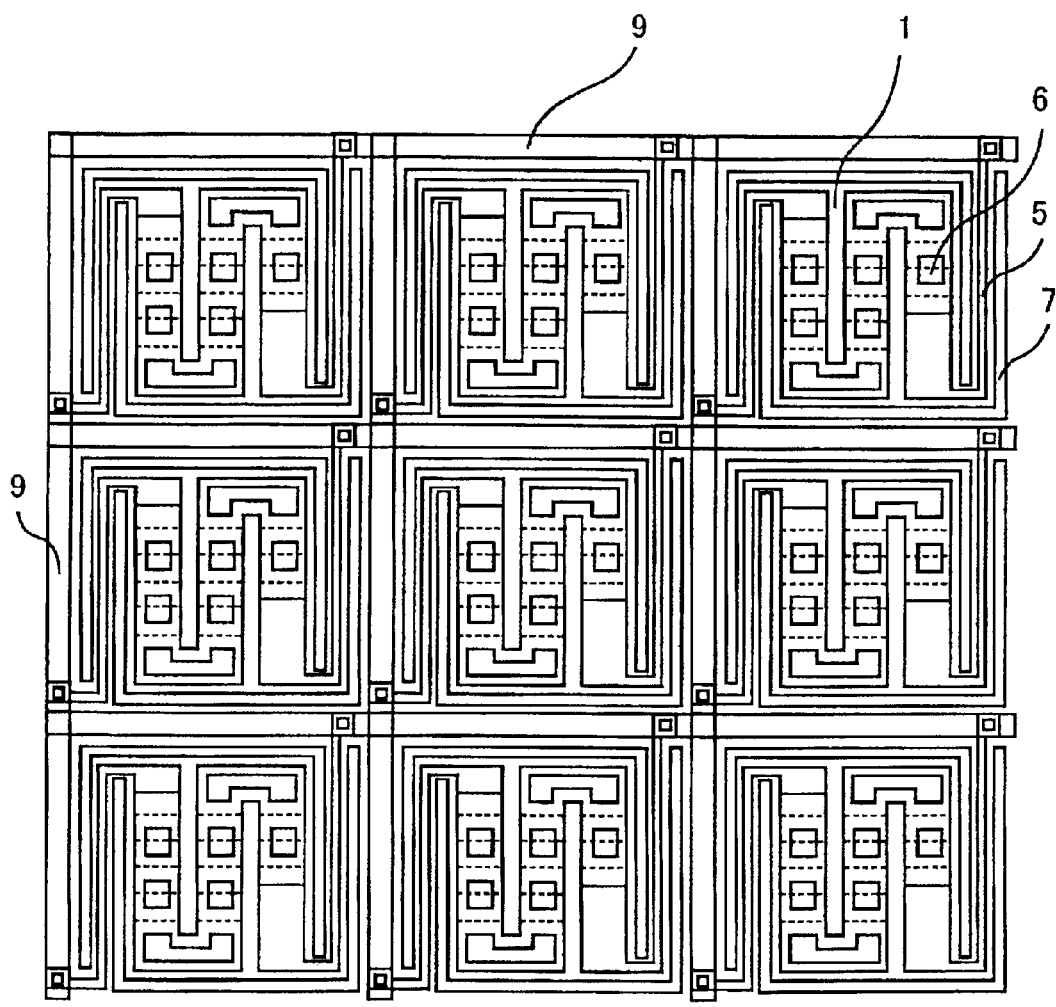
FIG. 5 is a top plan view showing the constitution of an infrared detector in accordance with the present invention.

FIGS. 1(a) and 1(b) are enlarged views of an infrared detector in the present invention in which FIG. 1(a) is a view seen from just above and FIG. 1(b) is a sectional view of FIG. 1(a). In such an infrared detector, a detecting portion 1 for detecting an irradiated infrared ray is arranged on a concave portion 4 formed in a semiconductor substrate 3, and is held by a support beam 5 in a hollow state with respect to the semiconductor substrate 3. The detecting portion 1 is formed by a silicon oxide film 10. A PN junction diode 2 is embedded in the detecting portion 1, and is connected by a metallic silicide wire 6. Further, a support beam wire 7 is embedded in the support beam 5, and connects the detecting portion 1 and a circuit wire 9 formed in the semiconductor substrate. FIG. 2 is a perspective view showing the construction of the infrared detector shown in FIG. 1 and shows a situation in which the detecting portion 1 is held in the hollow state with respect to the semiconductor substrate 3. FIG. 3 is a perspective view showing a state in which a plurality of such infrared detectors is arranged. FIG. 3 shows a case in which the infrared detector shown in FIG. 2 is arranged longitudinally and transversally every three lines. Since such a plurality of infrared detectors in the present invention are arranged by an array structure in this way, it is possible to use the infrared detector as e.g., an infrared camera. FIG. 4 is a perspective view showing a construction in which such an infrared detector has an infrared absorbing portion 8 every each detecting portion 1. The infrared absorbing portion 8 is thermally connected to the detecting portion 1 by an unillustrated support column. A light receiving area of the infrared ray can be increased by arranging such an infrared absorbing portion 8, and detecting sensitivity of the infrared ray can be improved. FIG. 5 is a view in which the infrared detector shown in FIG. 3 is seen from just above.

An operation of the infrared detector will next be explained.

According to the infrared detector of the present invention, when an infrared ray is irradiated to the infrared absorbing portion 8 or the detecting portion 1, heat is conducted from the infrared absorbing portion 8 to the detecting portion 1, or heat is directly generated in the detecting portion 1. Thus, the PN junction diode 2 of the detecting portion 1 changes heat to electricity so that a voltage according to an irradiated infrared ray amount is generated. The generated voltage is sequentially transmitted to the metallic silicide wire 6 and each diode, and is transmitted to the circuit wire 9 on a semiconductor substrate by the support beam wire 7. At this time, when light irradiation for performing the thermoelectric changing by the plurality of PN junction diodes is performed, a voltage value generated in each diode is added and contributes to an improvement of the detecting sensitivity. The circuit wire 9 is connected to a display unit such as an image processor, etc. connected to a signal processing-transmitting circuit although this construction is not shown in the drawings. Data of the detected infrared ray are changed to a thermal image and thermal data, and are then outputted by using a display device such as a camera, etc.

In this embodiment, both wire for connecting the plurality of PN junction diodes 2 arranged in the detecting portion 1, and the support beam wire 7 for connecting the detecting portion 1 and the circuit wire 9 arranged on the semiconductor substrate 3 are constructed by the metallic silicide, but one of these wires may be constructed by the metallic silicide.

As mentioned above, in accordance with the infrared detector in the present invention, at least one of the wires for connecting the plurality of PN junction diodes 2 arranged in the detecting portion 1, and the support beam wire 7 for connecting the detecting portion 1 and the circuit wire 9 arranged on the semiconductor substrate 3 is formed by a silicon compound. Accordingly, in comparison with a conventional constructional example, an insulating film required between the thermoelectric changing means and a connection wire and a metallic connection wire become unnecessary and heat capacity of the infrared ray and a heat time constant can be reduced Further, since the insulating film constituting the support beam is simultaneously thinly formed, thermal conductance can be also reduced and high sensitivity can be attained in a low heat time constant as it is.

Embodiment 2

Figure 6:
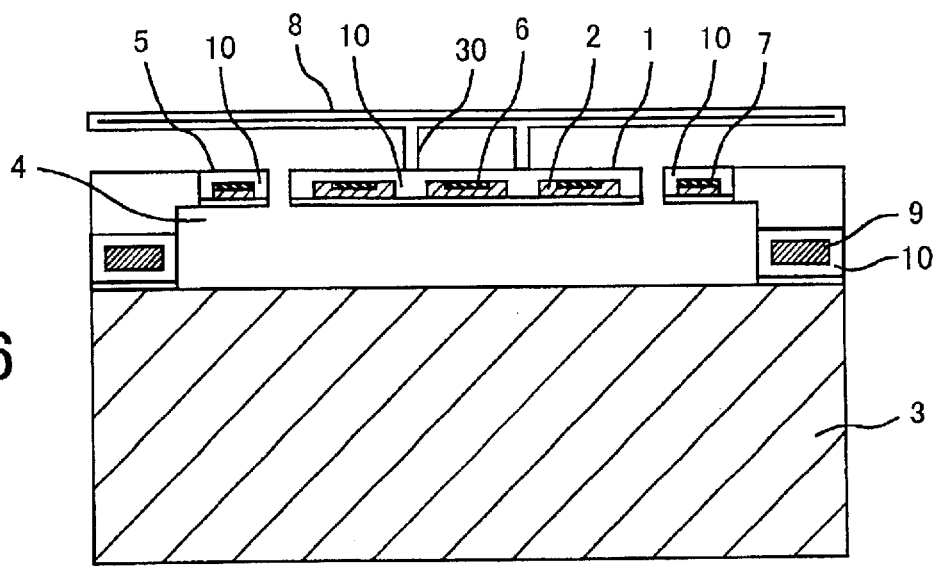
FIG. 6 is a cross-sectional view showing the constitution of an infrared detector in accordance with the present invention.

FIG. 6 is an example of a cross-sectional constitutional illustration showing the constitution of an infrared detector according to the present invention. In the infrared detector according to the present invention, a detection part 1 in which the plurality of PN junction diodes 2 are formed is supported by a support beam 5 to apart from a semiconductor substrate 3 in a hollow state. Such structure of an infrared detector according to the present invention, the thermal insulation increases and the detection performance of the infrared detector improves. The support beam 5 includes a wire 7 for electrically connecting the PN junction diode 2 to a circuit wire 9. Further, an infrared ray absorbing part 8 for effectively absorbing incoming infrared rays is provided on the detection part 1 and is thermally connected to the detection part 1 with a support column 30. The plurality of PN junction diodes 2 are connected in series with a metal silicide wire 6. Such a metal silicide wire 6 is formed by directly attaching metal to silicon constituting a diode and subjecting it to a necessary heat treatment. Further, as is the case with the conventional infrared detector, the detection part 1, the support beam 5, and the circuit wire 9 are covered with an insulating film 10 such as a silicon oxide film or the like.

Figure 7:
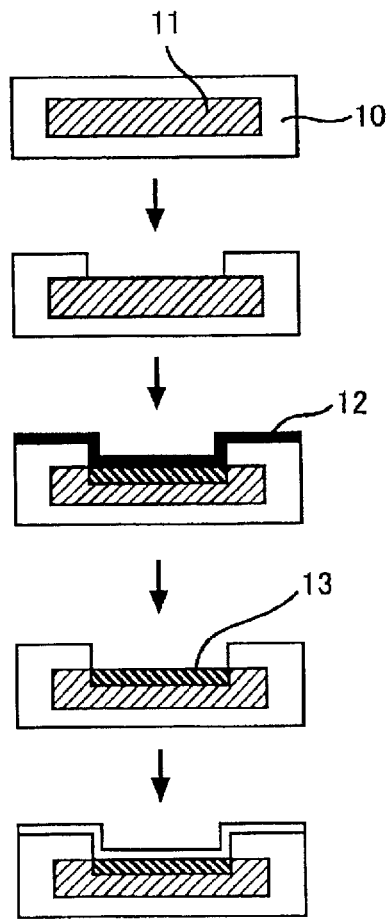
FIG. 7 is a view showing a method of manufacturing an infrared detector in accordance with the present invention.

FIG. 7 is an illustration to show a manufacturing method of a wire for connecting respective thermoelectric convertible means provided in the detection part 1. In such a manufacturing method of a wire, first, the surface of silicon 11 covered with a silicon oxide film 10 or the like is exposed by the use of etching or the like. Next, a metal film 12 is evaporated on the surface to which silicon 11 is exposed and then is subjected to a conventional heat treatment to form a metal silicide 13. After the metal silicide 13 is formed, an unnecessary metal film existing on the insulating film is removed by etching. Such a manufacturing method of the metal silicide corresponds to a process called a salicide which is used for reducing a diffusion resistance in manufacturing a MOS transistor, and is a technology conventionally used for manufacturing a semiconductor. By manufacturing the metal silicide 13 by the use of such a conventional technology, the infrared detector can be manufactured at low costs. Even in the conventional infrared detector, there is a case in which a metal silicide layer 110 is formed at the interface between the PN junction diode 102 and the metal wire 106. This is intended to reduce the contact resistance between the silicon 102 and the metal film wire 106 and to reduce noises produced at a contact portion and is different from the present invention which is intended to eliminate the need for the metal wire on a metal silicide and the insulating film between the metal wire and a silicon film by wiring only with a metal silicide wire 6 and to reduce a thermal conductance and a heat capacity at the same time. In this connection, needless to say, the resistance of such a metal silicide wire 6 can be controlled also by changing the thickness of a metal material or a silicon layer forming the metal silicide.

Figure 8A:
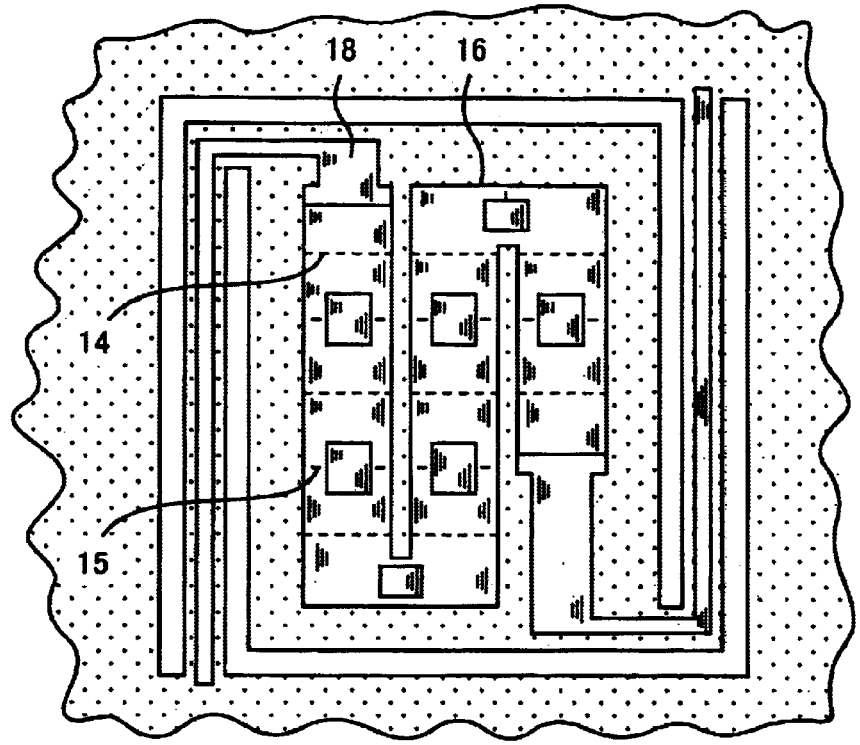
FIGS. 8(a) and 8(b) are top plan views showing the constitution of an infrared detector in accordance with the present-invention.
Figure 8B:
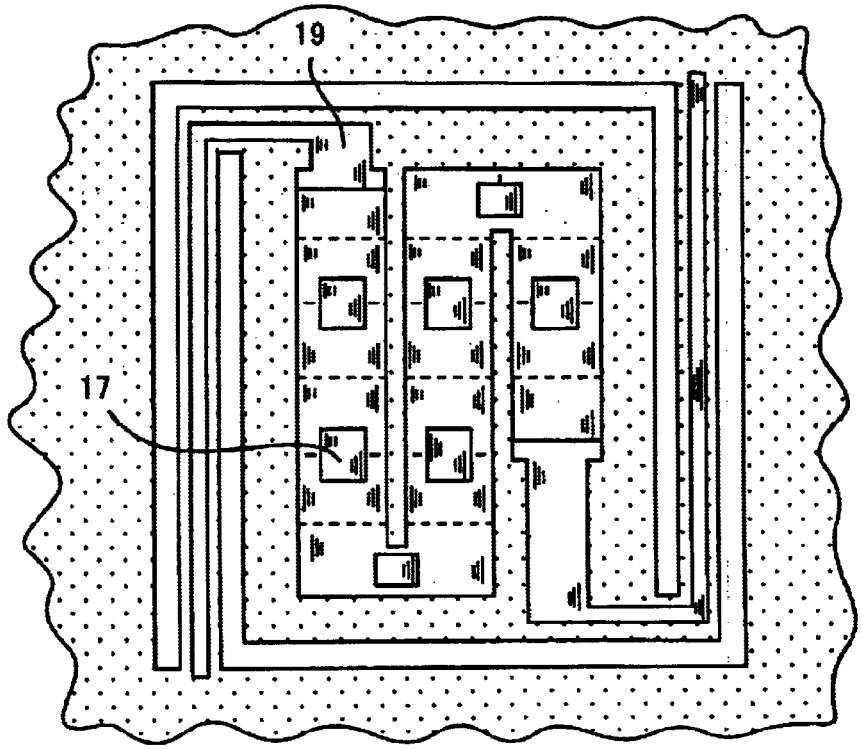

FIG. 8(*a*) is an illustration to show a connection method of junctions in the case where PN junctions 14 of a normal bias are continuously combined with NP junctions of a reverse bias. That is, a repeated pattern 16 like PNPN . . . is formed and the surface of silicon at the portion of an NP connection 15 which becomes a reverse bias is exposed and a metal film is attached to the surface of the silicon to form a metal silicide wire 17 to develop an electrical short circuit, whereby the respective diodes can be connected in series in a state of normal bias. In the constitution shown in FIG. 8(*a*), such a repeated pattern 16 is connected to a circuit formed in a semiconductor substrate with a metal wire 18 formed in the support beam.

FIG. 8(*b*) shows a constitution in which a wire formed in a support beam part is formed by a silicon film forming a PN junction diode. As is the method described above, silicon is exposed and a metal film is attached thereto to form a metal silicide wire 19, which eliminates the need for a metal wire for connecting the PN junction diode to the support beam wire.

In this connection, if the electric resistance of the wire in the support beam portion is too high, a change in temperature of the PN junction diode can not be fully read out to degrade sensitivity, but if the electric resistance is too low, thermal conductance usually increases and hence degrades the sensitivity. For this reason, in the present embodiment, the wire in the support beam part is formed by making a part of silicon film into a silicide, whereby the predetermined thermal conductance and electrical resistance can be produced.

Embodiment 3

Figure 9:
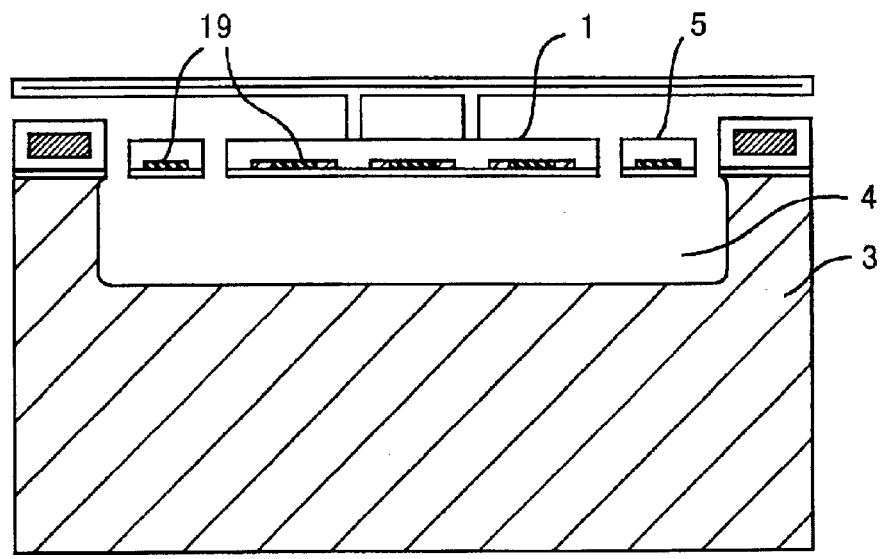
FIG. 9 is a cross-sectional view showing the constitution of an infrared detector in accordance with the present invention.
Figure 10:
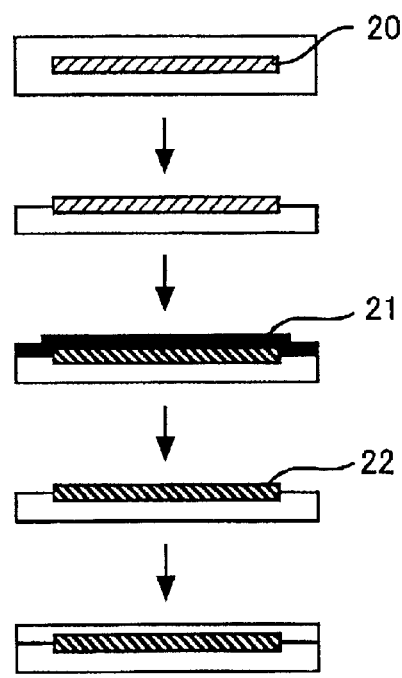
FIG. 10 is a view showing a method of manufacturing an infrared detector in accordance with the present invention.

FIG. 9 is an example of a cross-sectional constitutional illustration to show the constitution of an infrared detector in accordance with the present invention. In such an infrared detector, a semiconductor substrate 1 is provided with a concave portion 4 and is made thermally independent of a detection part 1, which leads to an improvement in the sensitivity of the infrared detector. Further, as shown in FIG. 10, the thickness of a silicon film used for a wire or the like is adjusted so that the silicon film reacts with a metal 21 to completely become a silicide. In such an infrared detector, the thickness of a silicide layer 22 is determined by the film thickness of a silicon film 20 formed in the first place, so the predetermined electric resistance and thermal conductance characteristics can be easily obtained.

Embodiment 4

Figure 11:
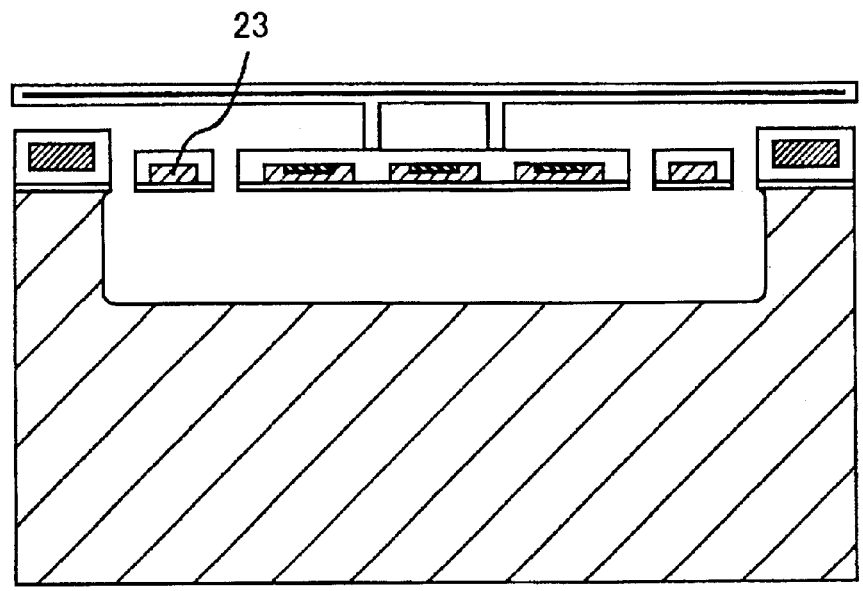
FIGS. 11, 12, and 13 are cross-sectional views showing the constitution of an infrared detector in accordance with the present invention.

FIG. 11 is an example of a cross-sectional constitutional illustration to show the constitution of an infrared detector in accordance with the present invention. In such an infrared detector, the wire 23 in a support beam part is formed only by a silicon thin film. The electric resistance of the silicon thin film can be reduced by doping the silicon thin film with boron in high concentration but is made slightly larger as compared with the case where the silicon thin film is made into a metal silicide. In this embodiment, a process can be simplified to reduce manufacturing costs and hence this embodiment is most suitable for an infrared detector in which a cost reduction is a main object and the high resistance of the wire does not present a problem.

Embodiment 5

Figure 12:
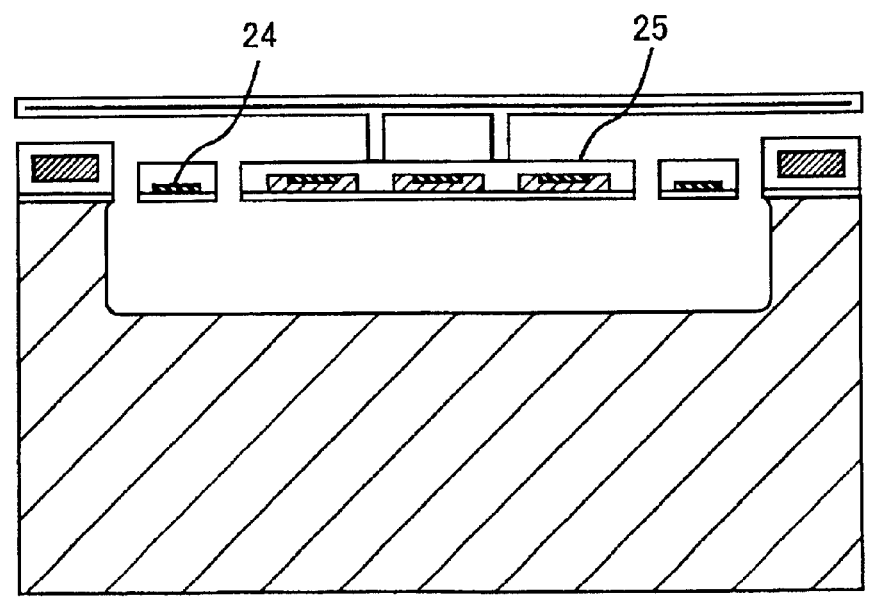

FIG. 12 is an example of a cross-sectional constitutional illustration to show the constitution of an infrared detector in accordance with the present invention. In such an infrared detector, the thickness of a silicon film used for a wire 24 is different from the thickness of a silicon film of a PN junction diode 25. In such an infrared detector, the wire 24 is completely made into a silicide and, in the PN junction diode 25, a region serving as a contact and a wire is constituted by a double structure of silicon/silicide. In a portion serving as the contact and the wire in the PN junction diode 25, by making the surface layer of silicon into a silicide, two objects of reducing the resistance of the wire and the resistance of the contact can be solved at the same time. Further, such a constitution makes it possible to set the thickness of the silicon film constituting the PN junction diode and the wire of the support beam part at suitable values, which makes it easy to adjust device characteristics.

Embodiment 6

Figure 13:
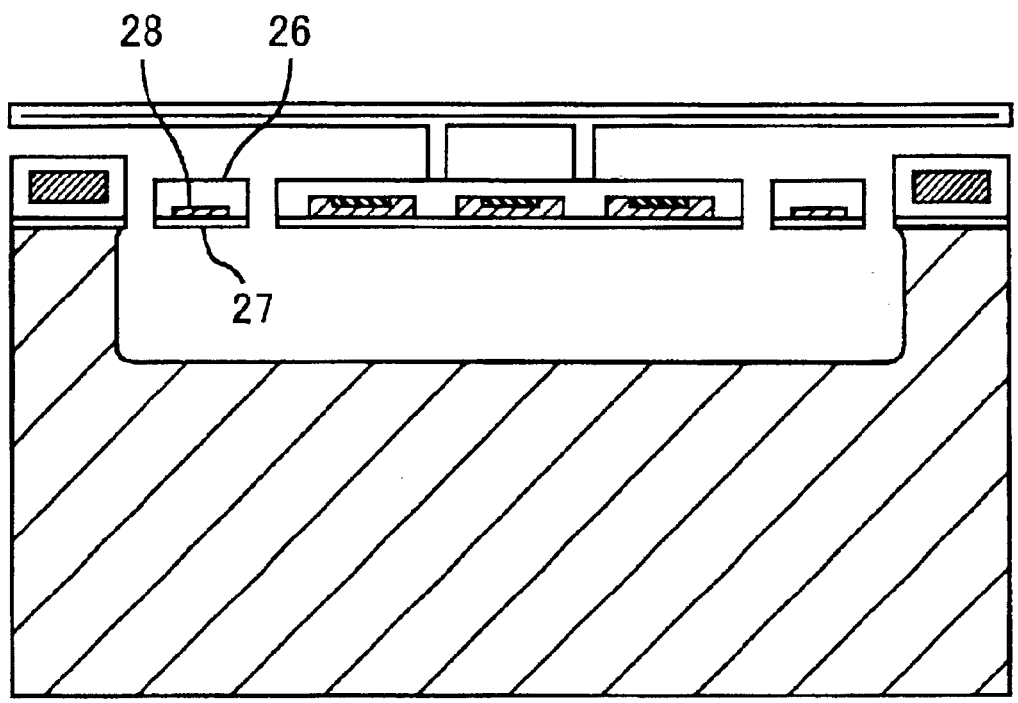
Figure 14:
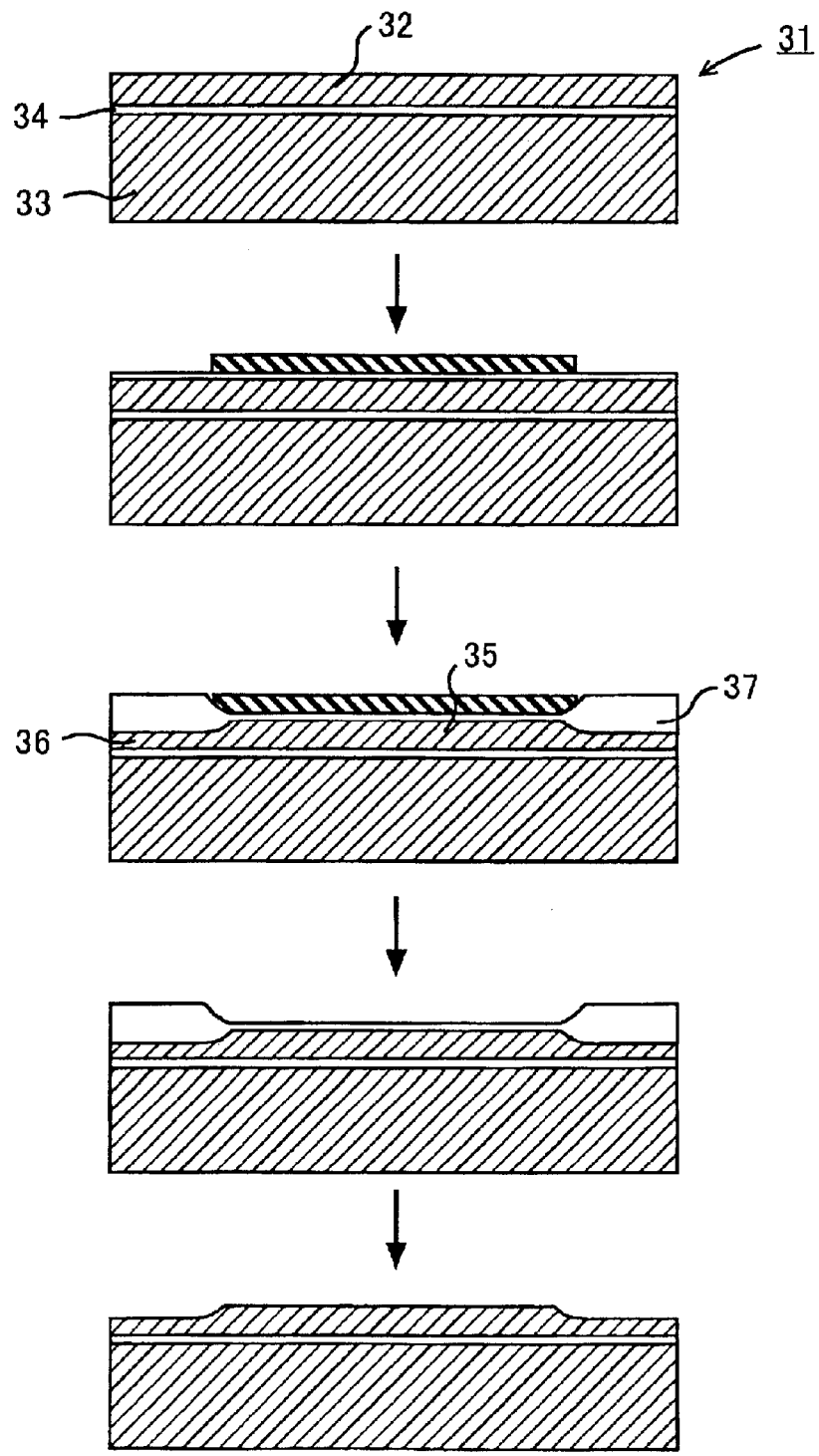
FIGS. 14, 15, and 16 are views showing a method of manufacturing an infrared detector in accordance with the present invention.

FIG. 13 is an example of a cross-sectional constitutional illustration to show the constitution of an infrared detector in accordance with the present invention. In such an infrared detector, the thickness of a silicon film of a PN junction diode part is made different from the thickness of a silicon film of a support beam to satisfy the required values of the respective characteristics. In a support beam wire 28, since the thickness of a silicon film is previously set at a suitable value so that it produces necessary electric resistance and thermal conductance, it is different from the thickness of a silicon film in a device region. Therefore, this constitution is suitable for a use in which the high resistance of the support beam does not present a problem because this can simplify a process and reduce costs. FIG. 14 shows a manufacturing method of such an infrared detector. A SOI wafer 31 has a structure in which a silicon film 32 and a silicon substrate 33 sandwich a silicon oxide film 34. In the silicon film 32 are formed a PN junction diode and a support beam and, for example, in the case where the thickness of a silicon film 36 used for the wire of the support beam is made thinner than a PN junction diode part 35, the support beam is previously selectively oxidized to form a selective oxide film 37. This is a method called LOCOS (local oxidation of silicon) oxidation and can selectively oxidize a necessary portion. Thereafter, the selective oxide film 37 is completely removed to arbitrarily adjust the thickness of the film at a predetermined portion.

Embodiment 7

Figure 15:
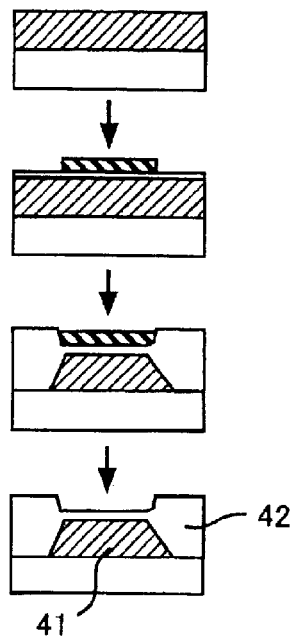
Figure 16:
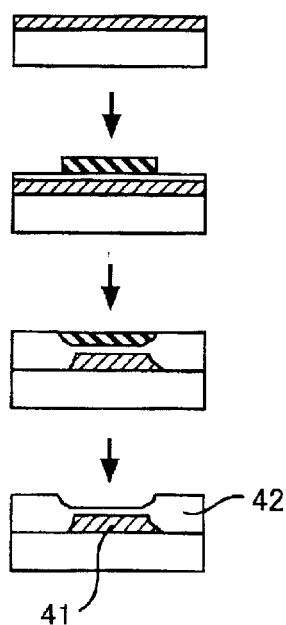

FIG. 15 is an example of an illustration to show a method of manufacturing an infrared detector in accordance with the present invention. In such a method of manufacturing an infrared detector, a silicon film 41 formed in a region other than the region used for a wire and a PN junction diode is oxidized by a selective oxidation method to form a selective oxide film 42 to determine the region used for the wire and the PN junction diode. This method has an advantage that uneven portions are hard to make as compared with a method of patterning a silicon film by etching so as to determine a silicon region and has a feature of preventing the uneven portions from causing some portions to remain unetched in the following step. In this case, the selective oxide film 42 is formed on a region in which silicon is not necessary and has a thickness of about two times the thickness of the silicon film 41 formed in a region other than the region used for the wire and the PN junction diode. Accordingly, if the thickness of the silicon film 41 formed in a region other than the region used for the wire and the PN junction diode is large, the thermal conductance and heat capacity of the silicon film and the silicon oxide film which constitute a support beam increase. In this case, the thickness of the selective oxide film determining the region of the wire and the PN junction diode can be reduced by subjecting the silicon film to the selective oxidation film forming treatment shown in FIG. 16 to reduce both the thermal conductance and the heat capacity to realize an infrared detector having a higher sensitivity and a higher response speed. A method of forming such a selective oxide film is the same as the method shown in FIG. 14 and the use of this method makes it possible to individually adjust the thickness of the silicon layer and further to thin a silicon oxide film which is a constituent element of a detection part other than the silicon film.

Embodiment 8

Figure 17:
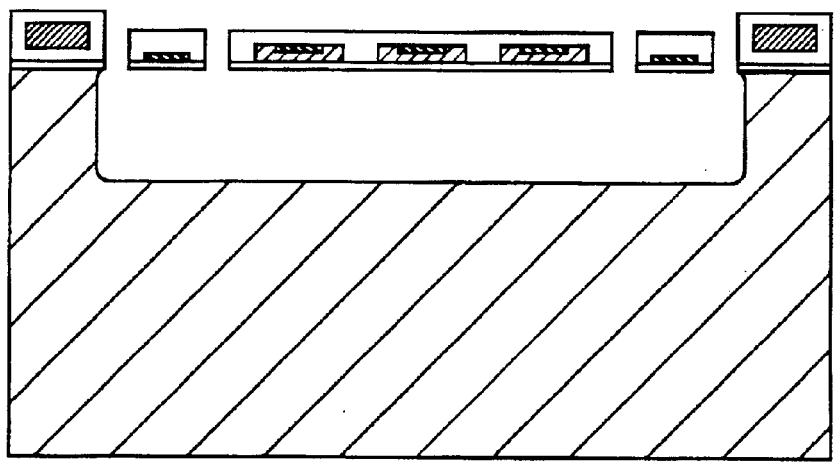
FIGS. 17, 18, and 19 are cross-sectional views showing the constitution of an infrared detector in accordance with the present invention.

FIG. 17 is an example of a cross-sectional constitutional illustration to show the constitution of an infrared detector in accordance with the present invention. Such an infrared detector has a structure different from the structure shown in FIGS. 6, 9 and 11–13, and does not have an infrared ray absorbing part. Since such an infrared detector does not have the heat capacity of the infrared ray absorbing part, it is slightly reduced in sensitivity but has an advantage of improving its thermal response. Further, in the case where the infrared detector has thermal response set at the same level as the one provided with the infrared ray absorbing part, it is possible to increase the sensitivity of the infrared detector by reducing the thermal conductance thereof.

Embodiment 9

Figure 18:
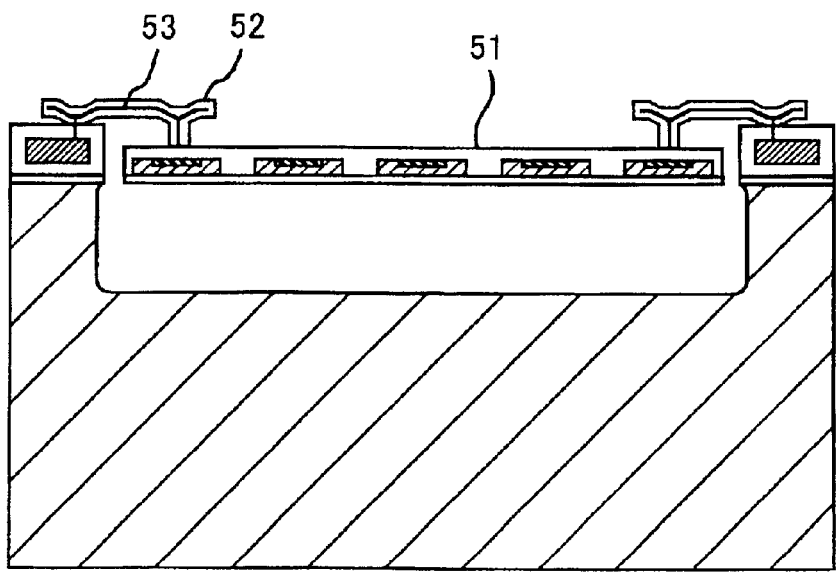

FIG. 18 is an example of a cross-sectional constitutional illustration to show the constitution of an infrared detector in accordance with the present invention. Such an infrared detector is different from the infrared detectors shown in FIGS. 6, 9, 11–13 and 17, and has a structure in which a detection part 51 including a thermoelectric changing means and formed only of silicon and metal silicide hanging by a support beam 52 having a high thermal insulation. In the support beam 52 is built a wire 53 formed of in et al. In such an infrared detector, since the detection part 51 does not include a metal wire and an interlayer insulating film, it can realize a low heat capacity and hence can reduce its thermal conductance by using a metal wire having a suitable thermal conductivity and film thickness.

Embodiment 10

Figure 19:
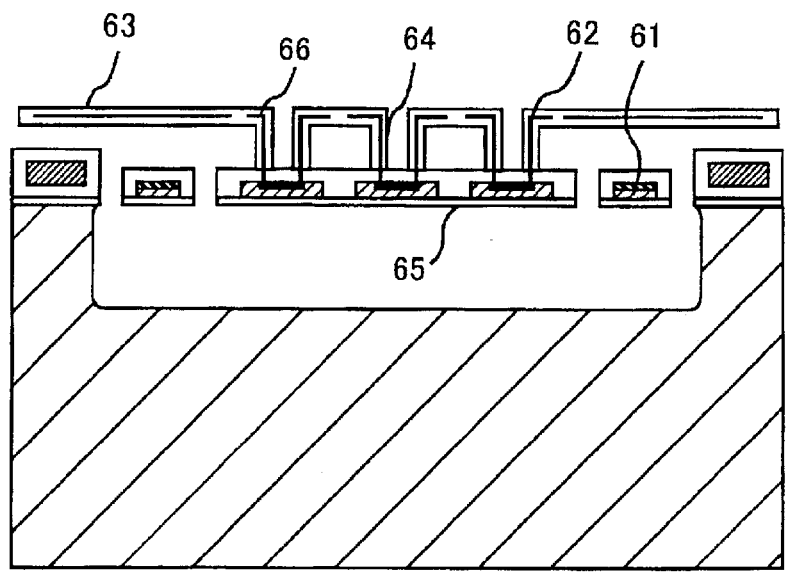

FIG. 19 is an example of a cross-sectional constitutional illustration to show the constitution of an infrared detector in accordance with the present invention. In such an infrared detector, the wire 61 of a support beam part is formed of silicide and a wire 62 for connecting the respective thermoelectric changing means is formed of metal and metal silicide in the usual manner. In such an infrared detector, heat generated at an infrared ray absorbing part 63 formed to improve sensitivity increase the temperature of a detection part 65 through a thermal connection part 64, and the thermal connection part 64 is common to an electric connection part 66 of the metal wire and the detection part 65. A metal wire is formed in an photoelectric changing part but does not increase an excessive heat capacity because it is a part of an infrared ray absorbing structure. For this reason, an electrically conducting part is formed of only silicon and metal silicide and hence can realize low thermal conductance and low heat capacity at the same time.

Embodiment 11

Figure 20:
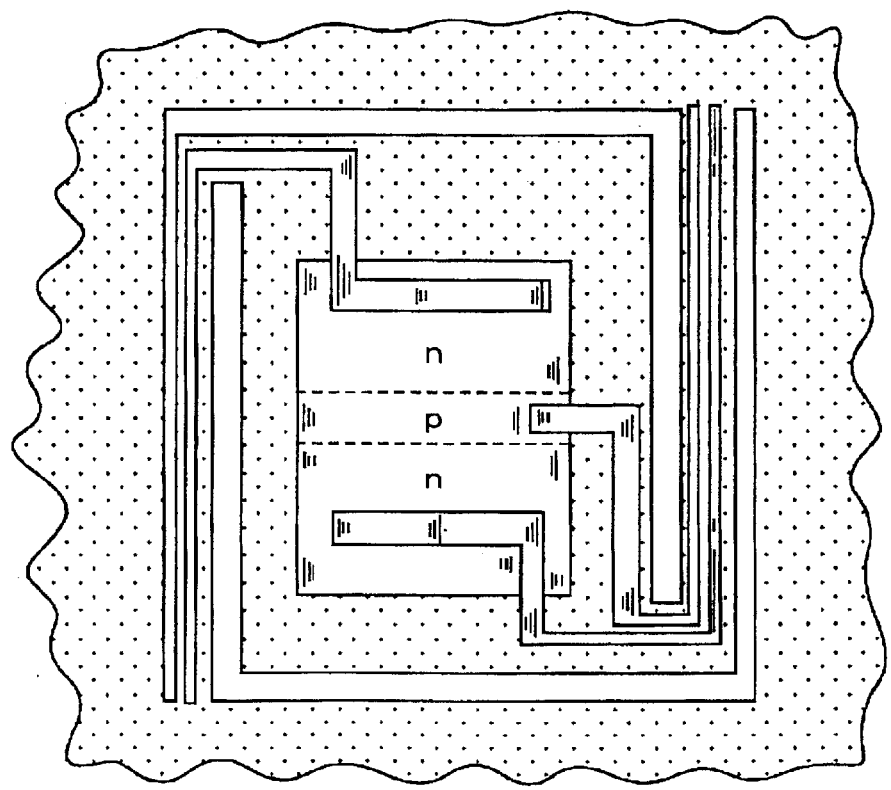
FIG. 20 is a top plan view showing the constitution of an infrared detector in accordance with the present invention.

FIG. 20 is an example of a constitutional illustration to show the constitution of an infrared detector in accordance with the present invention. Such an infrared detector has a bipolar transistor having an NPN junction as a function element whose electrically conducting part is formed of only silicon and metal silicide. As a thermoelectric changing means used for a detection part can be used various kinds of transistors such as a bipolar junction transistor, a junction type field effect transistor (JFET), a MOS field effect transistor (MOSFET) in addition to the above-mentioned PN junction diode. A transistor formed in a silicon thin film is formed of a metal wire and a silicon film, as disclosed in Japanese Laid-Open Patent Publication 218442/1999, and hence an infrared detector using such a transistor can be manufactured. In the case where such a metal wire is applied to a silicon film and a silicide layer, it is possible to accomplish a thin detector and hence to reduce the thermal conductance and heat capacity thereof, which leads to the realization of an infrared detector having a higher sensitivity and a higher response speed. In an infrared detector utilizing a thermoelectric changing means which is formed in a silicon thin film and whose electric characteristics varies with its temperature, as is the infrared detector described above, the heat capacity thereof can be reduced by using a metal silicide layer as a part of the electrical conducting part of the infrared detector. Further, since the thermal conductance thereof can also be reduced at the same time, an infrared detector having a high response speed and a high sensitivity can be realized.

Embodiment 12

Figure 21A:
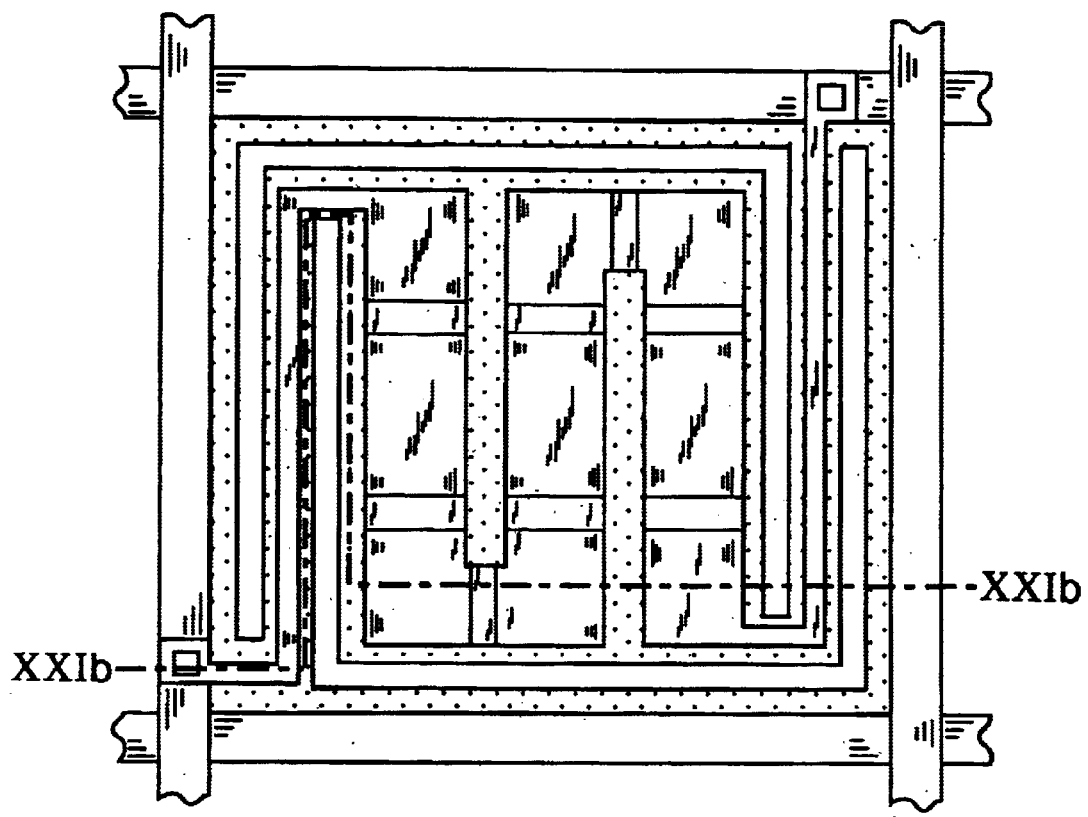
FIG. 21(a) is a top plan view showing the constitution of an infrared detector in accordance with the present invention.
Figure 21B:
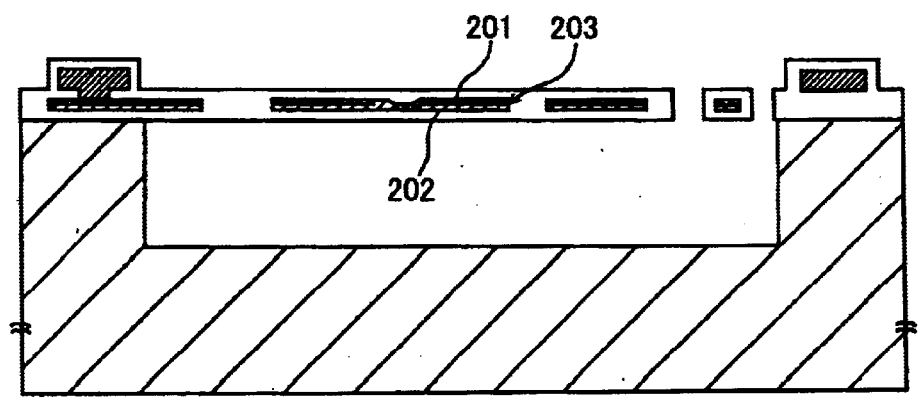
FIG. 21(b) is across-sectional view of FIG. 21(a).
Figure 22:
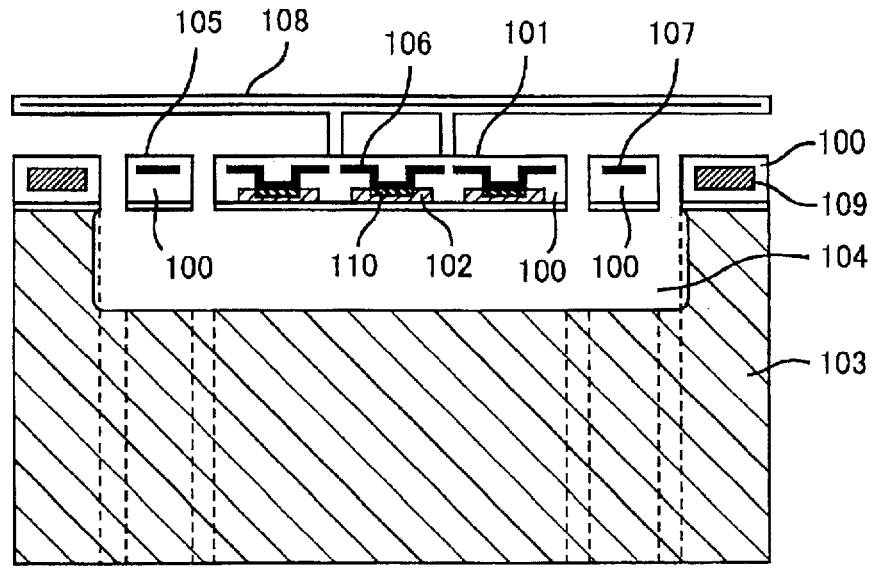
FIG. 22 is a cross-sectional view showing the constitution of a conventional infrared detector.
Figure 23:
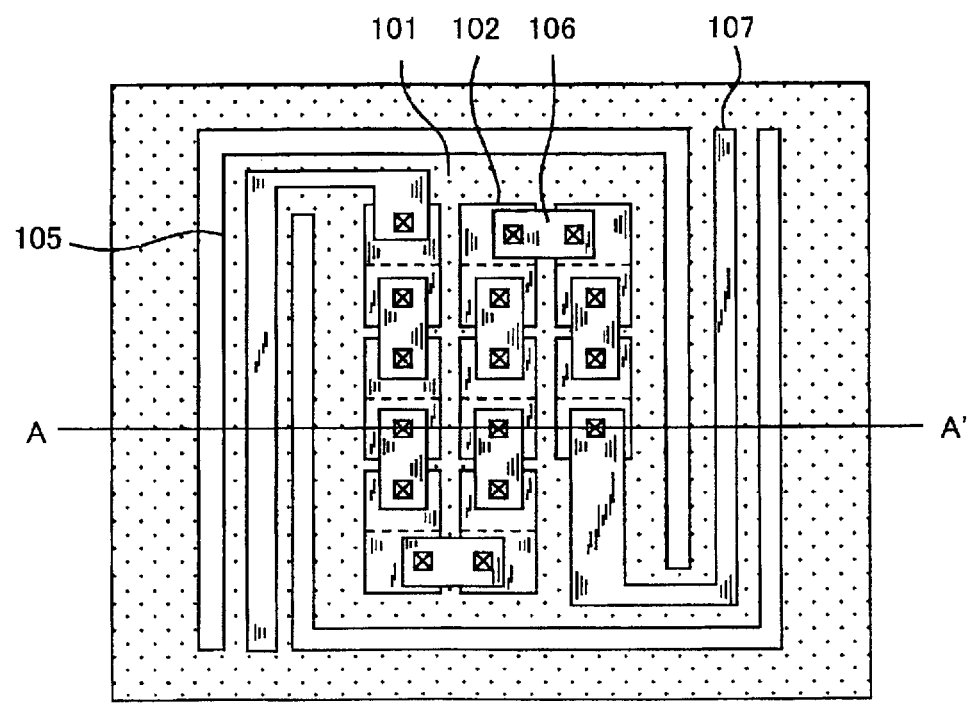
FIG. 23 is a top plan view showing the constitution of a conventional infrared detector.
Figure 24A:
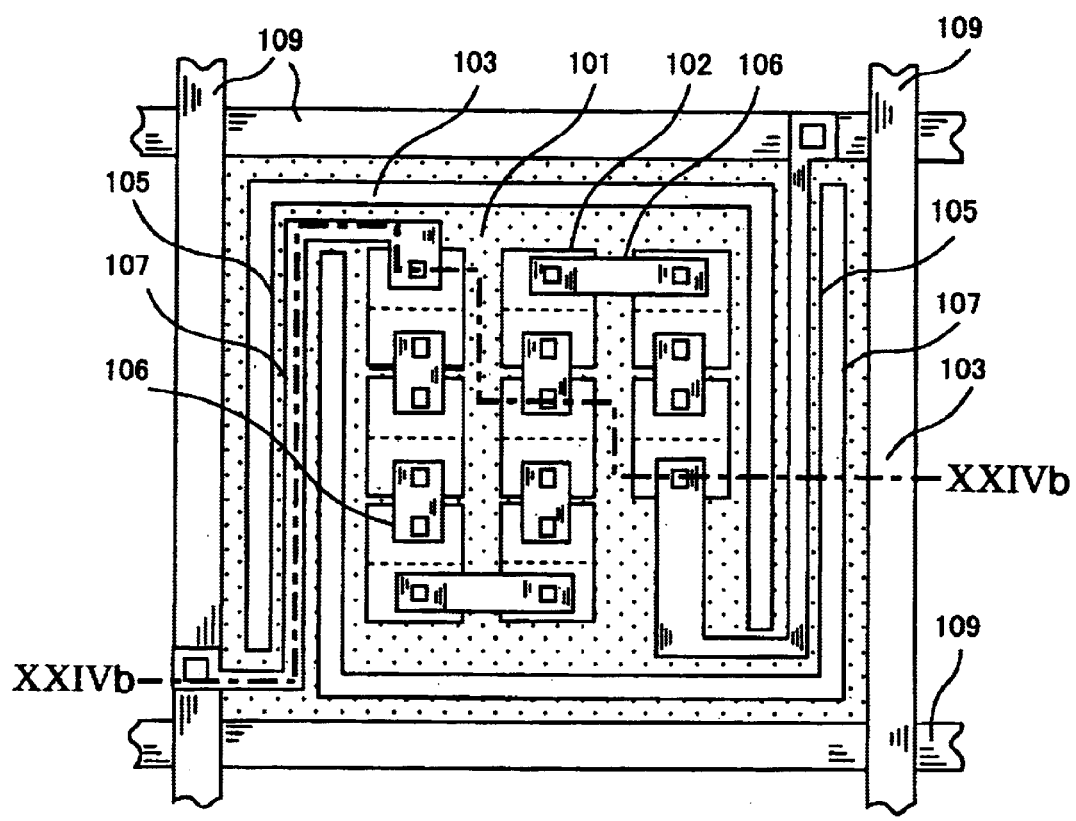
FIG. 24(a) is a top plan view showing the constitution of a conventional infrared detector.
Figure 24B:
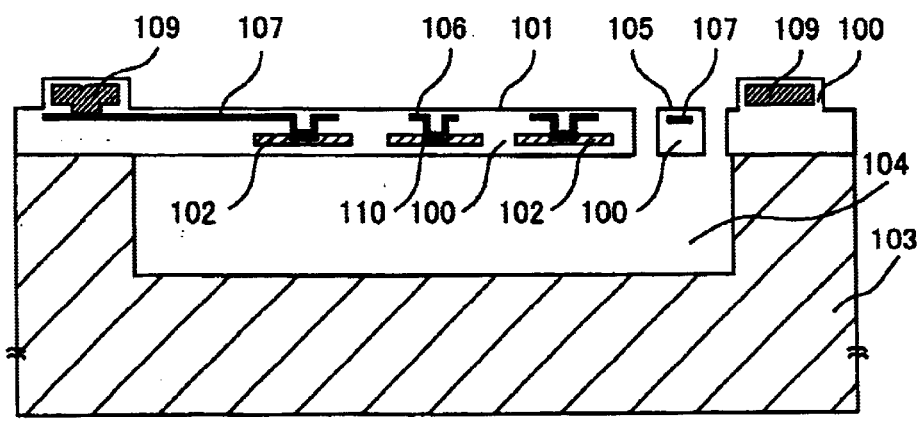
FIG. 24(b) is a cross-sectional view showing the constitution of a conventional infrared detector.

FIG. 21 is an example of a constitutional illustration to show the constitution of an infrared detector in accordance with the present invention. In the above embodiments, the PN junction diode is used as the thermoelectric changing means. However, in this embodiment, a Schottky barrier diode is used instead of the PN junction diode. When the above PN junction diode is used as the thermoelectric changing means, a dopant is injected to the interface of silicide wire and a silicon layer at high concentration, and ohmic contact is caused. However, when no dopant having a predetermined amount or more is injected to the interface of the silicide wire 201 and the silicon layer 202, Schottky connection is formed and functions as a diode. In this Schottky barrier diode, the temperature dependence of electric characteristics can be arbitrarily adjusted by suitably selecting an impurity type of the silicon layer and the silicide and setting the Schottky barrier to a predetermined height. Platinum silicide and titanium silicide can be used, for example, as such silicide wire.

As mentioned above, in the infrared detector of this embodiment, the Schottky barrier diode formed by the silicide wire and the silicon layer can be utilized as the thermoelectric changing means so that a manufacturing process can be suitably simplified.

As mentioned above, in accordance with the present invention, an infrared detector according to the present invention is invented so as to solve the above mentioned problem and includes a semiconductor substrate provided with a single crystal silicon thin film arranged and held in a hollow state at a predetermined distance above the semiconductor substrate, a plurality of thermoelectric changing means which are embedded in the single crystal silicon thin film and able to change heat energy generated by an infrared ray irradiated to the single crystal silicon thin film to an electric signal, a first connecting layer which are embedded in the single crystal silicon thin film and electrically connecting the plurality of thermoelectric changing means to each other and a second connecting layer for transmitting the electric signal outputted from the thermoelectric changing means to wire formed in the semiconductor substrate. And further, at least one of the first and second connecting layers is constructed by a silicon compound Therefore, it is possible to reduce heat capacity and a heat constant of at least one of wires for electrically connecting the plurality of thermoelectric changing means, and wire for transmitting the electric signal outputted from the thermoelectric changing means to the semiconductor substrate. Accordingly, thermal conductance can be correspondingly reduced so that an infrared detector operated at high speed with high sensitivity can be realized.

According to such an infrared detector, in the case where the plurality of thermoelectric changing means are connected in series by the first connecting layer, it is possible to realize an infrared detector having a detection part with an improved sensitivity and hence having a high response speed and a high sensitivity.

Further, in the case where the single crystal thin film is arranged and held in a hollow state at a predetermined distance above the semiconductor substrate by a support beam, it is possible to realize an arrangement in which the semiconductor substrate is further surely thermally independent of the detection part, which is preferable.

Still further, in the case where the second connecting layer is embedded in the support beam, since it becomes no metal wire which connecting the thermoelectric changing means and the circuit wire on a semiconductor substrate is necessary, it is possible to reduce the thermal conductance and the heat capacity and hence to easily realize an infrared detector having a high response speed and a high sensitivity.

According to such an infrared detector, in the case where the second connecting layer has a thickness different from the thickness of the single crystal silicon thin film, it is possible to constitute the first and the second connecting layer having preferable thickness setting for demanded properties, which is preferable.

Still further, in the case where the second connecting layer has formed of a material different from a silicon compound constituting the first connecting layer, it is possible to constitute the first and the second connecting layer making preferable material setting for demanded properties, which is preferable.

According to such an infrared detector, in the case where such an infrared detector further includes an infrared ray receiving part arranged in front of the single crystal silicon thin film and connected to the single crystal silicon thin film by a support column, it is possible to effectively receive the infrared rays applied thereto and hence to easily realize an infrared detector having a high response speed and a high sensitivity.

Further, in the case where the single crystal silicon thin film is formed above a concave portion formed on the surface of the semiconductor substrate, it is easy to realize an arrangement in which the semiconductor substrate is thermally independent of the detection part and hence to realize an infrared detector having a high sensitivity, which is preferable.

Still further, in the case where the silicon compound is formed of a metal silicide, it is possible to substantially reduce the heat conductance and the heat capacity of the wiring part, which is preferable.

According to such an infrared detector, in the case where the thermoelectric changing means is formed of a junction diode, a bipolar transistor, a junction field effect transistor, a MOS transistor, or a Schottky barrier diode, or a combination of them, since the thermoelectric changing means can be manufactured by the use of a conventional semiconductor manufacturing process, it is possible to simplify the manufacturing process of the infrared detector and to obtain an infrared detector having a high response speed and a high sensitivity at low costs with ease.

What is claimed is:

1. An infrared detector comprising:

a semiconductor substrate having a hollow;

a detecting portion comprising a single crystal silicon thin film, located opposite the hollow at a distance from said semiconductor substrate;

a plurality of PN junction diodes embedded in said single crystal silicon thin film for converting heat energy, generated by infrared light irradiating said single crystal silicon thin film, into an electrical signal;

a first connecting layer embedded in said single crystal silicon thin film and electrically connecting said plurality of PN junction diodes to each other; and a second connecting layer embedded in said single crystal silicon thin film for transmitting the electric signal output from said plurality of PN junction diodes to a wire in said semiconductor substrate, wherein both of said first and second connecting layers are silicon compounds.

2. The infrared detector of claim 1, wherein said plurality of PN junction diodes are connected in series by said first connecting layer.

3. The infrared detector of claim 1, including a support beam supporting said detecting portion.

4. The infrared detector of claim 3, wherein said second connecting layer is embedded in said support beam.

5. The infrared detector of claim 3, wherein said support beam and said single crystal silicon thin film including said plurality of PN junction diodes have respective different thicknesses.

6. The infrared detector of claim 1, wherein said detecting portion has a thickness and said second connecting layer has a thickness different from the thickness of said detecting portion.

7. The infrared detector of claim 1, wherein the silicon compound of said first connecting layer is a different silicon compound from said second connecting layer.

8. The infrared detector of claim 1, further comprising an infrared light detector located in front of said detecting portion and a support column connecting said infrared light detector to said detecting portion.

9. The infrared detector of claim 1, wherein said silicon compounds are metal silicides.

* * * * *